US008575471B2

(12) United States Patent
Norman et al.

(10) Patent No.: US 8,575,471 B2
(45) Date of Patent: *Nov. 5, 2013

(54) LATTICE MATCHED SEMICONDUCTOR GROWTH ON CRYSTALLINE METALLIC SUBSTRATES

(75) Inventors: Andrew G. Norman, Evergreen, CO (US); Aaron J. Ptak, Littleton, CO (US); William E. McMahon, Denver, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 1083 days.

This patent is subject to a terminal disclaimer.

(21) Appl. No.: 12/551,397

(22) Filed: Aug. 31, 2009

(65) Prior Publication Data
US 2011/0048514 A1   Mar. 3, 2011

(51) Int. Cl.
*H01L 31/0304*   (2006.01)
*H01L 21/20*   (2006.01)

(52) U.S. Cl.
USPC ........... 136/255; 136/262; 136/252; 438/478; 438/94; 257/103; 257/84; 257/184; 257/190; 257/200; 257/201; 257/E33.003; 257/E31.04; 257/E29.091; 257/E29.09; 257/E31.022

(58) Field of Classification Search
USPC ............. 136/255, 262; 438/478, 94; 257/103, 257/84, 184, 190, 200, 201, E33.003, 257/E31.04, E29.091, E29.09, E31.022
See application file for complete search history.

(56) References Cited

U.S. PATENT DOCUMENTS

| | | |
|---|---|---|
| 4,136,207 A | 1/1979 | Bender |
| 5,793,061 A | 8/1998 | Ohuchi et al. |
| 5,796,771 A | 8/1998 | DenBaars et al. |
| 6,281,426 B1 | 8/2001 | Olson et al. |
| 6,498,050 B2 | 12/2002 | Fujimoto |
| 6,518,077 B2 | 2/2003 | Narayan et al. |
| 6,605,486 B2 | 8/2003 | Fujimoto |

(Continued)

FOREIGN PATENT DOCUMENTS

| | | |
|---|---|---|
| WO | 03084886 | 10/2003 |
| WO | 2004022820 | 3/2004 |

(Continued)

OTHER PUBLICATIONS

Sands, et al., "Epitaxial growth of GaAs/NiAl/GaAs heterostructures", Applied Physics Letters, Apr. 11, 1988, vol. 52, No. 15, pp. 1216-1218.

(Continued)

*Primary Examiner* — Golam Mowla
(74) *Attorney, Agent, or Firm* — Paul J. White; J. Patrick Kendrick

(57) ABSTRACT

Methods of fabricating a semiconductor layer or device and said devices are disclosed. The methods include but are not limited to providing a metal or metal alloy substrate having a crystalline surface with a known lattice parameter (a). The methods further include growing a crystalline semiconductor alloy layer on the crystalline substrate surface by coincident site lattice matched epitaxy. The semiconductor layer may be grown without any buffer layer between the alloy and the crystalline surface of the substrate. The semiconductor alloy may be prepared to have a lattice parameter (a') that is related to the lattice parameter (a). The semiconductor alloy may further be prepared to have a selected band gap.

11 Claims, 8 Drawing Sheets

(56) References Cited

U.S. PATENT DOCUMENTS

| | | | |
|---|---|---|---|
| 6,759,139 | B2 | 7/2004 | Kunisato et al. |
| 6,844,084 | B2 | 1/2005 | Kokta et al. |
| 6,951,819 | B2 | 10/2005 | Iles et al. |
| 7,012,283 | B2 | 3/2006 | Tsuda et al. |
| 7,122,733 | B2 | 10/2006 | Narayanan et al. |
| 7,211,836 | B2 | 5/2007 | Udagawa |
| 7,220,324 | B2 | 5/2007 | Baker et al. |
| 7,390,684 | B2 | 6/2008 | Izuno et al. |
| 7,601,215 | B1 | 10/2009 | Wang et al. |
| 7,615,400 | B2 | 11/2009 | Goto et al. |
| 2002/0144725 | A1 | 10/2002 | Jordan et al. |
| 2003/0015728 | A1 | 1/2003 | Bosco et al. |
| 2003/0162271 | A1 | 8/2003 | Zhang et al. |
| 2005/0124161 | A1 | 6/2005 | Rawdanowicz et al. |
| 2006/0060237 | A1 | 3/2006 | Leidholm et al. |
| 2006/0126688 | A1 | 6/2006 | Kneissl |
| 2006/0236923 | A1 | 10/2006 | Kouvetakis et al. |
| 2007/0243703 | A1 | 10/2007 | Pinnington et al. |
| 2008/0029151 | A1 | 2/2008 | McGlynn et al. |
| 2008/0191203 | A1 | 8/2008 | Fujioka et al. |
| 2008/0217622 | A1 | 9/2008 | Goyal |
| 2008/0230779 | A1 | 9/2008 | Goyal |
| 2008/0245409 | A1 | 10/2008 | Varghese et al. |
| 2008/0265255 | A1 | 10/2008 | Goyal |
| 2008/0308836 | A1 | 12/2008 | Nakahara et al. |
| 2009/0032799 | A1 | 2/2009 | Pan |
| 2009/0042344 | A1 | 2/2009 | Ye et al. |
| 2009/0045393 | A1 | 2/2009 | Nakahara |
| 2009/0065047 | A1 | 3/2009 | Fiorenza et al. |
| 2009/0078311 | A1 | 3/2009 | Stan et al. |
| 2009/0087941 | A1 | 4/2009 | Goto et al. |
| 2009/0140296 | A1 | 6/2009 | Park et al. |
| 2009/0155952 | A1 | 6/2009 | Stan et al. |
| 2010/0212729 | A1* | 8/2010 | Hsu .............................. 136/255 |
| 2011/0014791 | A1 | 1/2011 | Johnson et al. |
| 2011/0049520 | A1 | 3/2011 | Norman et al. |
| 2011/0062446 | A1 | 3/2011 | Goyal |

FOREIGN PATENT DOCUMENTS

| | | |
|---|---|---|
| WO | 2004025707 | 3/2004 |
| WO | 2006033858 A1 | 3/2006 |
| WO | 2007025062 | 3/2007 |
| WO | 2008112115 | 9/2008 |
| WO | 2008112115 A1 | 9/2008 |
| WO | 2008112115 A1 | 12/2008 |
| WO | 2009096931 A1 | 8/2009 |
| WO | 2009096932 A1 | 8/2009 |
| WO | 2009110872 A2 | 9/2009 |
| WO | 2009110872 A3 | 12/2009 |

OTHER PUBLICATIONS

Sands, et al., "Epitaxial Metal (NiAl)-Semiconductor (III-V) Heterostructures by MBE", Surface Science, 1990, vol. 228, pp. 1-8.
Scarpulla, et al., "GdN (1 1 1) heteroepitaxy on GaN (0 0 0 1) by N2 plasma and NH3 molecular beam epitaxy", Journal of Crystal Growth, 2009, vol. 311, pp. 1239-1244.
Sun, et al., "Mg-doped green light emitting diodes over cubic (111) MgA1204 substrates", Applied Physics Letters, Mar. 17, 1997, vol. 70, No. 11, pp. 1444-1446.
Suzuki, et al., "MBE growth of GaN on MgO substrate", Journal of Crystal Growth, 2007, vols. 301-302, pp. 478-481.
Tadayon, et al., "Growth of GaAs-Al-GaAs by migration-enhanced epitaxy", Applied Physics Letters, Dec. 26, 1988, vol. 53, No. 26, pp. 2664-2665.
Tinjod, et al., "Alumina-rich spinel: A new substrate for the growth of high quality GaN-based light-emitting diodes", Journal of Crystal Growth, 2005, vol. 285, pp. 450-458.
Tolle, et al., "Epitaxial growth of group III nitrides on silicon substrates via a reflective lattice-matched zirconium diboride buffer layer", Applied Physics Letters, Apr. 14, 2003, vol. 82, No. 15, pp. 2398-2400.
Trampert, et al., "Heteroepitaxy of Large-Misfit Systems: Role of Coincidence Lattice", Crystal Research and Technology, 2000, vol. 35, pp. 793-806.
Tsuchiya, et al., "Initial stages of InN thin film growth onto MgA12O4 (111) and α-A12O3 (0 0-1) substrates", Journal of Crystal Growth, 2000, vol. 220, pp. 191-196.
Vurgaftman, et al., "Band parameters for nitrogen-containing semiconductors", Journal of Applied Physics, Sep. 15, 2001, vol. 94, No. 6, pp. 3675-3696.
Yang, et al., "Microstructure evolution of GaN buffer layer on MgA12O4 substrate", Journal of Crystal Growth, 1998, vol. 193, pp. 478-483.
Yamada, et al., "Strong photoluminescene emission from polycrystalline GaN layers grown on W, Mo, Ta, and Nb metal substrates", Applied Physics Letters, May 7, 2001, vol. 78, No. 19, pp. 2849-2851.
Yao, et al., "Fabrication of AlAs/Al/AlAs heterostructures by molecular beam epitaxy and migration enhanced epitaxy", Journal of Crystal Frowth, 1991, vol. 111, pp. 221-227.
Wang, et al., "Lattice Parameters and Local Lattice Distortions in fcc-Ni Solutions", Metallurgical and Materials Transactions A, Mar. 2007, vol. 38A, pp. 562-569.
Zhao, et al., "Transmission electron microscrope study on electrodeposited Gd2O3 and Gd2Zr2O7 buffer layers for YBa2Cu3O7-δ superconductors", Physica C, 2008, vol. 468, pp. 1092-1096.
Andrianov, et al., "Time-Resolved Photoluminescence of Polycrystalline GaN Layers of Metal Substrates", Semidconductors, 2002, vol. 36, No. 8, pp. 878-882.
As, et al., "Heteroepitaxy of Doped and Undoped Cubic Group III-Nitrides", physica status solidi (a), 1999, vol. 176, pp. 475-485.
Asahi, et al., "Strong Photoluminescence Emission from Polycrystalline GaN Grown on Metal Substrate by NH3 Source MBE", physica status solidi (a), 2001, vol. 188, No. 2, pp. 601-604.
Haxel, et al. "Rare Earth Elements—Critical Resources for High Technology", U.S. Geological Survey Fact Sheet 087-02, 2002, pp. 1-4.
Bailey, et al. "Thin Film Poly III-V Space Solar Cells", Proceedings of the 33rd IEEE PVSC, May 2007, pp. 1-5, San Diego, California.
Baker, et al., "Characterization of Plannar Semipolar Gallium Nitride Films on Spinel Substrates", Japanese Journal of Applied Physics, 2005, vol. 44, No. 29, pp. L920-L922.
Baur, et al., "Triple-Junction III-V Based Concentrator Solar Cells: Perspectives and Challenges", Journal of Solar Energy Engineering, Aug. 2007, Cvol. 129, pp. 258-265.
Bergh, et al., "The Promise and Challenge of Solid-State Lighting", Physics Today, Dec. 2001, pp. 42-47.
Oh, et al., "Epitaxial Growth and Characterization of GaAs/Al/GaAs Herterostructures", Surface Science, 1990, vol. 228, pp. 16-19.
Bhattacharya, et al., "Growth and characterization of GaAs/Al/GaAs heterostructures", Journal of Applied Physiology, Apr. 15, 1990, vol. 67, No. 8, pp. 3700-3705.
Cantoni, et al., "Reflection high-energy electron diffraction studies of epitaxial oxide seed-layer growth on rolling-assisted biaxially textured substrate Ni (001): The role of surface structure and chemistry", Applied Physics Letters, Nov. 5, 2001, vol. 79, No. 19, pp. 3077-3079.
Cho, et al., "Single-crystal-aluminum Schottky-barrier diodes prepared by molecular-beam epitaxy (MBE) on GaAs", Journal of Applied Physiology, Jun. 1978, vol. 49, No. 6, pp. 3328-3332.
Efimov, et al., "On an Unusaul Azimuthal Orientational Relationship in the System Gallium Nitride Layer on Spinel Substrate", Crystallography Reports, 2000, vol. 45, No. 2, pp. 312-317.
Feltrin, et al., "Material considerations for terawatt level deployment of photovoltaics", Renewable Energy, 2008, pp. 180-185.
Findikoglu, et al., "Aligned-Crystalline Silicon Films on Non-Single-Crystalline Substrates", Los Alamos National Laboratory publication, MRS, 2006, Report No. LA-UR-06-1165, pp. 1-11.
Freitas, Jr., et al., "Properties of epitaxial GaN on refractory metal substrates", Applied Physics Letters, 2007, vol. 90, pp. 091910-1-091910-3.

(56) References Cited

OTHER PUBLICATIONS

Fritzemeier, et al., "Progress Toward High Efficiency Thin Film Photovoltaics", High-Performance PV—2007 Program Review Meeting, 2007, pp. 1-2.

Geisz, et al., "III-N-V semiconductors for solar photovoltaic applications", Semiconductor Science and Technology, 2002, vol. 17, pp. 769-777.

Geisz, et al., "High-efficiency GaInP/GaAS/InGaAs triple-junction solar cells grown inverted with a metamorphic bottom junction", Applied Physics Letters, 2007, vol. 91, pp. 023502-1-023502-3.

Geisz, et al., "40.8% efficient inverted triple-junction solar cell with two independently metamorphic junctions", Applied Physics Letters, 2008, vol. 93, pp. 123505-1-123505-3.

George, et al., "Novel symmetry in the growth gallium nitride on magnesium aluminate substrates", Applied Physics Letters, Jan. 15, 1996, vol. 68, No. 3, pp. 337-339.

Goyal, et al., "The RABiTS Approach: Using Rolling-Assisted Biaxially Textured Substrates for High-Performance YBCO Superconductors", MRS Bulletin, Aug. 2004, pp. 552-561.

Haworth, et al., Investigation into the influence of buffer and nitrided layers on the initial stages of GaN growth on InSb (100), Applied Surface Science, 2000, vol. 166, pp. 418-422.

Hirata, et al., "Epitaxial growth of AlN films on single-crystalline Ta substrates", Journal of Solid State Chemistry, 2007, vol. 180, pp. 2335-2339.

Hu, et al., "Nucleation and growth of epitaxial ZrB2(0 0 0 1 on Si (1 1 1)", Journal of Crystal Growth, 2004, vol. 267, pp. 554-563.

Inoue, et al., "Epitaxial growth of AlN on Cu (1 1 1) substrates using pulsed paser deposition", Journal of Crystal Growth, 2006, vol. 289, pp. 574-577.

Inoue, et al., "Epitaxial growth of GaN on copper substrates", Applied Physics Letters, 2006, vol. 88, pp. 261910-1-261910-3.

Khan, et al., "Cleaved cavity optically pumped InGaN-GaN laser grown on spinel substrates", Applied Physics Letters, Oct. 14, 1996, vol. 69, No. 16, pp. 2418-2420.

King, et al., "40% efficient metamorphic GaInP/GaInAs/Ge multijunction solar cells", Applied Physics Letters, 2007, vol. 90, pp. 183516-1-183516-3.

King, "Multijunction solar cells used in concentrator photovoltaics have enabled record-breakiong efficiencies in electricity generation from the Sun's energy, and have the potential to make solar electricity cost-effective at the utility scale", Nature Photonics, May 2008, vol. 2, pp. 284-286.

Kuo, "Bowing parameter of zincblende $InxGa_{1-x}N$", Optics Communications, 2007, vol. 280, pp. 153-156.

Kuramata, et al., "Properties of GaN Epitaxial Layer Grown on (111) MgA12O4 Substrate", Solid-State Electronics, 1997, vol. 41, No. 2, pp. 251-254.

Li, et al., "Room temperature green light emission from nonpolar cubic InGaN/GaN multi-quantum-wells", Applied Physics Letters, 2007, vol. 90, pp. 071903-1-071903-3.

Li, et al., "Room-Temperature Epitaxial Growth of GaN on Atomically Flat MgA12O4 Substrates by Pulsed-Laser Depostition", Japanese Journal of Applied Physics, 2006, vol. 45, No. 17, pp. L457-L459.

Li, et al., "Epitaxial growth of single-crystalline AlN films on tungsten substrates", Applied Physics Letters, 2006, vol. 89, pp. 241905-1-241905-3.

Lieten, et al., "Suppression of domain formation in GaN layers grown on Ge (1 1 1)", Journal of Crystal Growth, 2009, vol. 311, pp. 1306-1310.

Ludeke, "Morphological and chemical considerations for the epitaxy of metals on semiconductors", Journal of Vacuum Science & Technology. B, Microelectronics and nanometer structures : processing, measurement, and phenomena : an official journal of the American Vacuum Society, Jul.-Sep. 1984, vol. 2, No. 3, pp. 400-406.

Massies, et al., "Epitaxial Relationships between Al, Ag and GaAs{001} Surfaces", Surface Science, 1982, vol. 114, pp. 147-160.

Mikulics, et al, "Growth and properties of GaN and AlN layers on silver substrates", Applied Physics Letters, 2005, vol. 87, pp. 212109-1-212109-3.

Mitamura, et al., "Growth of InN films on spinel substrates by puled laser deposition", physica status solidi (RRL)—Rapid Research Letters, 2007, vol. 1, No. 5, pp. 211-213.

Nikishin, et al., "Gas source molecular beam epitaxy of GaN with hydrazine on spinel substrates", Applied Physics Letter, May 11, 1998, pp. 2361-2363.

Norman, et al., "Low cost III-PV on A1-foil substrates", FY09 AOP Proposal—Seed Fund Project, 2009, pp. 1-5.

Norton, et al., "Epitaxial YBa2Cu3O7 on Biaxially Textured Nickel (001): An Approach to Superconducting Tapes with High Critical Current Density", Science, Nov. 1, 1996, vol. 274, pp. 755-757.

Pacheco-Salazar, et al., "Photoluminescence measurements on cubic InGaN layers deposited on a SiC substrate", Semiconductor Science and Technology, 2006, vol. 21, pp. 846-851.

Palmstøm, "Epitaxy of Dissimilar Materials", Annual Review of Materials Science, 1995, vol. 25, pp. 389-415.

Pan, et al., "Increasing cube texture in high purity aluminium foils for capacitors", Materials Science and Technology, 2005, vol. 21, No. 12, pp. 1432-1435.

Phillips, et al., "Research challenges to ultra-efficient inorganic solid-state lighting", Laser & Photonics Reviews, 2007, vol. 1, No. 4., pp. 307-333.

Phillips, et al., "UK cracks GaN-on-silicon LEDs", Compound Semidconductor, Mar. 2009, pp. 19-22.

Pilkington, et al., "The growth of epitaxial aluminium on As containing compound semiconductors", Journal of Crystal Growth, 1999, vol. 196, pp. 1-12.

Sacks, et al., "Growth and characterization of epitaxial $FexAl_{1-x}$/(In,Al)As/InP and III-V/$FexAl_{1-x}$/(In,Al)As/InP structures", Journal of Vacuum Science & Technology. B, Microelectronics and nanometer structures : processing, measurement, and phenomena : an official journal of the American Vacuum Society, May/Jun. 1999, vol. 17, No. 3, pp. 1289-1293.

Kuznetsov, G.F. et al., "General Orientational Characteristics of Heteroepitaxial Layers of AII and BVI Semiconductors on Sapphire and Semiconductor Substrates with Diamond and Sphalerite Structures (AIIIBV)," Crystallography Reports, vol. 47, No. 3, Nov. 3, 2002, pp. 514-518.

Narayan, J., et al., "Domain epitaxy: A unified paradigm for thin film growth," Journal of Applied Physics, V93, No. 1, pp. 278-285 (2003).

Goyal, A., et al., "Low Cost, Single Crystal-like Substrates for Practical, High Efficiency Solar Cells," AIP Conf. Proc. V404, pp. 377-394 (1997).

Ohta, J., et al., "Epitaxial growth of InN on nearly lattice-matched (Mn,Zn)Fe2O4," Solid State Communications, V137, pp. 208-211 (2006).

Trampert, A., "Heteroepitaxy of dissimilar materials: effect of interface structure on strain and defect formation," Physica E, V13, pp. 1119-1125 (2002).

Yang, J.W., et al., "InGaNGaN based lightemitting diodes over (111) spinel substrates," Applied Physics Letters, V69, pp. 369-370 (1996).

Zhou, G., "Metal-oxide interfaces at the nanoscale," Applied Physics Letters, V94, pp. 233115 1-3, (2009).

Armitage, R., et al., "Lattice-matched HfN buffer layers for epitaxy of GaN on Si," V81, No. 8, pp. 1450-1452, (2002).

Tolle, J., et al., "Epitaxial growth of group III nitrides on silicon substrates via a reflective lattice-matched zirconium diboride buffer layer," Applied Physics Letters, V82, pp. 2398-2400 (2003).

Hooks, D.E., et al., "Epitaxy and Molecular Organization on Solid Substrates," Advanced Materials (2000).

Zheleva, T., et al., "Epitaxial growth in largelatticemismatch systems," Journal of Applied Physics, V75, pp. 860-871 (1994).

Narayan, J., "New Frontiers in Thin Film Growth and Nanomaterials," Mettallurgical and Materials Transactions B, V36B, pp. 5-22 (2005).

Oh, J.E., et al., "Epitaxial Growth and Characteristics on GaAs/Al/GaAs Heterostructures,"Surface Science, V228 pp. 16-19 (1990).

\* cited by examiner

LATTICE MATCHED SEMICONDUCTOR GROWTH ON CRYSTALLINE METALLIC SUBSTRATES

CONTRACTUAL ORIGIN

The United States Government has rights in this invention under Contract No. DE-AC36-08GO28308 between the United States Department of Energy and the Alliance for Sustainable Energy, LLC, the manager and operator of the National Renewable Energy Laboratory.

BACKGROUND

Various types of semiconductor devices may be best fabricated using one or more layers of substantially crystalline semiconductor material. For example, the highest efficiency photovoltaic solar cells presently known are III-V multi junction cells epitaxially grown on single crystal Ge or GaAs substrates. One significant obstacle to the widespread deployment of high efficiency, large surface area, semiconductor devices such as crystalline III-V multi-junction photovoltaic cells is extremely high cost. In particular, the cost of suitable quantities of single-crystal GaAs or Ge substrate can be prohibitive if the cells are prepared in quantity using known techniques.

In addition to high cost, known techniques for the preparation of certain crystalline semiconductor materials allows for substantial defects which may compromise device performance. For example, there presently exists a major problem with light emitting devices such as light emitting diodes (LEDs), and lasers for solid state lighting applications based upon InGaN alloys in crystalline form. In particular, the efficiency of known InGaN devices at wavelengths between approximately 500 nm and 600 nm, corresponding to what is known as the "green gap", is very low. One possible cause of this efficiency problem is that the material quality of InGaN alloys having a suitable bandgap for emission in this wavelength region is degraded due to a tendency toward phase separation of the InGaN prepared by conventional techniques. One possibility for avoiding this serious problem is the epitaxial growth of lattice-matched InGaN alloys in which phase separation can be suppressed. Unfortunately, no suitable lattice-matched substrates for the epitaxial growth of InGaN alloys having band gaps suitable for emission in the "green gap" are known.

Because the cost of a single crystal substrate is prohibitive for large surface area devices such as thin film solar cells, most known thin-film cells are based on polycrystalline or amorphous device layers. The inclusion of polycrystalline layers may limit device performance. To overcome inefficiencies associated with polycrystalline layers, it is known in the prior art to fabricate large area, substantially crystalline, semiconductor devices beginning with a relatively inexpensive metallic substrate which has been processed to have a crystalline textured surface. The fabrication of these devices typically requires several intermediate fabrication steps and several buffer layers between the semiconductor alloy layer of interest, and the substrate. For example, a III-V semiconductor layer as is used for high efficiency solar cells will not typically lattice match with the crystalline structure of an inexpensive metal foil substrate. Accordingly, known techniques for preparing a large surface area semiconductor device on an inexpensive metal or metal alloy crystalline substrate involves the use of one or several buffer layers between the substrate and the semiconductor layer.

In particular, multiple buffer layers may be grown between the substrate and active layer to provide both a chemical barrier and a structural template upon which to grow the active semiconductor layer(s). A chemical barrier may be needed to prevent diffusion of potentially contaminating elements from the metal or metal alloy substrate into the semiconductor layer(s). A structural template is needed to properly lattice match the final buffer layer to the active semiconductor layer to minimize the density of defects in the active semiconductor layer(s).

The need to carefully lattice match between the crystalline substrate and the active semiconductor layer may require a large number of buffer layers which are carefully graded to transition from the substrate lattice parameter to the lattice parameter of the active layer. This technique for obtaining an approximate lattice match between each sequentially applied layer is known as a "graded buffer layer" approach. With a graded buffer layer approach, the number of buffer layers that must to be grown depends upon both the extent of lattice mismatch between the final active semiconductor layer and the substrate, and the extent of intermediate lattice mismatch which can be accepted.

The use of one or more buffer layers between the substrate and active semiconductor layer(s) introduces a different set of problems. Additional processing steps increases device cost. Furthermore, the buffer layers themselves may introduce impurities, defects or strain issues which negatively affect device performance.

The embodiments disclosed herein are intended to overcome one or more of the limitations described above. The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

One embodiment disclosed herein includes a method of fabricating a semiconductor layer. The method includes, but is not limited to providing a metal or metal alloy substrate having a crystalline surface with a known lattice parameter (a). The method further includes growing a crystalline semiconductor alloy layer on the crystalline substrate surface by coincident site lattice matched epitaxy. The semiconductor layer may be grown without any buffer layer(s) between the alloy and the crystalline surface of the substrate. The semiconductor alloy may be prepared to have a lattice parameter (a') that is related to the lattice parameter (a). Representative examples of relationships between (a') and (a) are where (a')=(a), 2(a), (a)/2, $\sqrt{2}$(a) or (a)/$\sqrt{2}$. The method may further include fabricating a semiconductor layer to have a selected band gap.

In selected embodiments the semiconductor layer will be prepared from a semiconductor alloy of Group III and Group V elements. For example, the semiconductor alloy layer may be an Al-containing arsenide and phosphide alloy, an antimonide or dilute nitride or bismide alloy. The alloy may be selected from the following non-exclusive list: substantially GaInAs, substantially GaInP, substantially GaInAsP, substantially AlInP substantially GaInAlP, substantially AlInAsP, substantially AlGaAsP, substantially GaInAsSb, substantially GaInAsN, and substantially GaAsBi. The foregoing list is set forth utilizing an abbreviated form. Alternatively, the alloy may be selected from the following non-exclusive list which is set forth in a less abbreviated form: substantially $Ga_xIn_{1-x}As$, substantially $Al_xIn_{1-x}As$ substantially $Ga_xIn_{1-x}P$, substantially $Ga_xIn_{1-x}As_yP_{1-y}$, substantially $Al_xIn_{1-x}P$ substantially $Ga_xIn_yAl_{1-x-y}P$, substantially $Ga_xIn_yAl_{1-x-y}As$, substantially $Al_xIn_{1-x}As_yP_{1-y}$, substantially $Al_xGa_{1-x}As_yP_{1-y}$, substantially $GaAs_ySb_{1-y}$, substantially $AlAs_ySb_{1-y}$, substantially $Ga_xIn_{1-x}As_ySb_{1-y}$, substantially $Al_xGa_{1-x}As_ySb_{1-y}$, substantially $Ga_xIn_{1-x}As_yN_{1-y}$, substantially $GaAs_yBi_{1-y}$, and substantially $Ga_xIn_{1-x}As_yBi_{1-y}$. It is important to note that the embodiments disclosed herein are not limited to any specific alloy, unless so limited by a claim. The above lists are intended to be of representative alloys and are not to be construed as limiting upon the scope of the disclosed embodiments.

The metal or metal alloy substrate may have a face centered cubic crystalline lattice with the (001) plane at the surface. Other crystal orientations and lattice types are, however, within the scope of the disclosure. As one non-limiting example, the substrate may be a substantially face-centered cubic crystalline Al substrate having purity in excess of 99%.

The semiconductor layer may be grown on the metal substrate by any epitaxial method. For example, the semiconductor layer may be grown by molecular beam epitaxy (MBE).

The method may also include growing second, third, fourth, or any number of crystalline semiconductor alloy layers sequentially on the first crystalline semiconductor alloy layer. The methods disclosed herein may be used to fabricate any type of electronic semiconductor based device, for example a photovoltaic device.

An alternative embodiment is an electronic device of any complexity prepared according to the methods described in detail above.

In addition to the exemplary aspects and embodiments described above, further aspects and embodiments will become apparent by reference to the drawings and by study of the following descriptions.

BRIEF DESCRIPTION OF THE DETAILED DRAWINGS

Exemplary embodiments are illustrated in referenced figures of the drawings. It is intended that the embodiments and figures disclosed herein are to be considered illustrative rather than limiting.

DESCRIPTION

Figure 1:
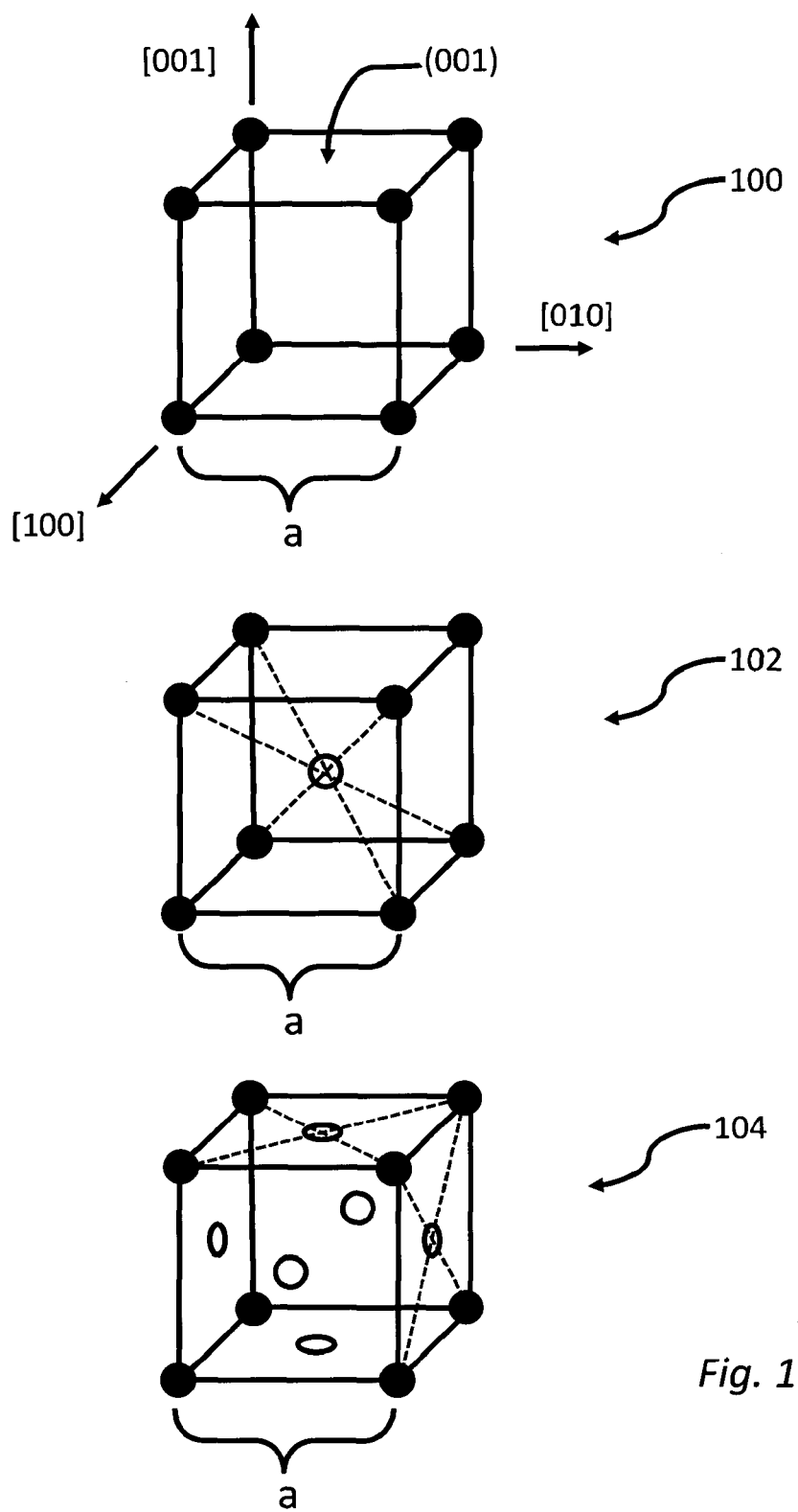
FIG. 1 is a schematic illustration of the unit cells of the three space lattice types of cubic crystal systems.

Unless otherwise indicated, all numbers expressing quantities of ingredients, dimensions, reaction conditions and so forth used in the specification and claims are to be understood as being modified in all instances by the term "about".

In this application and the claims, the use of the singular includes the plural unless specifically stated otherwise. In addition, use of "or" means "and/or" unless stated otherwise. Moreover, the use of the term "including", as well as other forms, such as "includes" and "included", is not limiting. Also, terms such as "element" or "component" encompass both elements and components comprising one unit and elements and components that comprise more than one unit unless specifically stated otherwise. A material may be described herein as being "single crystal." Single crystal very specifically means an ingot, wafer or epilayer that is truly a single crystal, with no grain boundaries. "Crystalline" is a more general term for a substantially crystalline material which can have grain boundaries. Crystalline shall be understood to mean substantially crystalline, and having sufficiently well developed crystal structure that one skilled in the art would refer to the material as being crystalline. The terms single crystal and crystalline do not mean absolutely defect free. Both types of material will have defects and or dislocations. Certain abbreviations may be made herein with respect to the description of semiconductor alloys. These abbreviations shall not be construed as limiting the scope of the disclosure or claims. For example, the form "InGaAlN" is a common abbreviation to improve readability in technical manuscripts. Abbreviated forms such as "InGaAlN" are defined as equivalent to an expanded form, for example; "$In_xGa_yAl_{1-x-y}N$".

High quality crystalline semiconductor materials which are relatively free of defects may be epitaxially grown on a proper substrate by known techniques. One variable which directly affects the ability to grow a relatively defect free crystalline semiconductor material is the degree of lattice match between the desired semiconductor material and the substrate. For example, it is somewhat easier to epitaxially grow crystalline Si on a substantially pure crystalline Si substrate than it is to grow crystalline Si on a dissimilar material because of the near perfect lattice match between the substrate and the semiconductor layer in the former case.

Similarly, high efficiency III-V multi junction solar cells have been epitaxially grown on single crystal Ge or GaAs substrates. The main barrier to the more widespread deployment of these or other highly efficient photovoltaic cells is high fabrication cost. A substantial portion of the total fabrication cost for such a device is the cost of a suitable single crystal substrate. It may also be noted that certain materials are quite useful if prepared in a relatively defect free crystalline form can not be readily prepared since these materials have no readily available lattice-matched substrate which may be used as the basis for an epitaxially prepared device. InGaN alloys are a representative example of this type of material. In particular, no suitable lattice-matched substrate for the preparation of selected InGaN alloys desirable for use in solid state lighting applications is known.

Accordingly, the various embodiments disclosed herein may be broadly categorized into two groups fulfilling different needs, without limiting the scope of this disclosure. The first group includes devices and methods of fabricating semiconductor layers and devices where the device is prepared by employing coincident site lattice matched epitaxy to grow a crystalline semiconductor alloy layer directly on a relatively inexpensive, possibly metallic, crystalline substrate. The second broad class of embodiments disclosed herein includes devices and methods of fabricating layers or devices where the semiconductor layer is grown by coincident site lattice matched epitaxy on a substrate where suitable substrates were previously unknown or otherwise resulted in production difficulties. The two broad classes identified above are identified for convenience in describing the embodiments disclosed herein and are not to be construed as limiting upon the scope of the disclosure in any way.

As used herein, epitaxy, epitaxial and epitaxially are generally defined as relating to the process where one crystalline substance is grown or deposited on another crystalline substance. As used herein in relation to epitaxial processes, "grown" and "grow" are synonymous with "deposited" and "deposit." Heteroepitaxy is a kind of epitaxy performed with materials that are different from each other. The methods disclosed herein involve heteroepitaxy. Various techniques are known for causing epitaxial growth, including but not limited to vapor-phase epitaxy (VPE), liquid phase epitaxy (LPE), molecular beam epitaxy (MBE), metal organic chemical vapor deposition (MOCVD) and others. The methods disclosed herein are not limited to any particular epitaxy method. The more specific phrase "coincident site lattice matched epitaxy" is defined as heteroepitaxy where there is a high degree of lattice match between the substrate and epitaxially grown layer(s), however the lattice match may be a rotated or scaled lattice match as described herein.

Figure 2A:
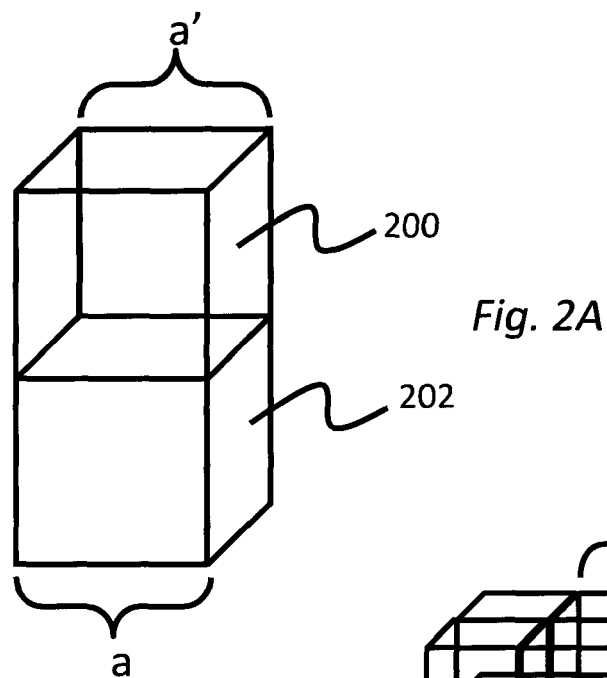
FIG. 2A is a schematic illustration of epitaxial growth were the lattice parameter of the substrate (a) equals the lattice parameter of the semiconductor (a')
Figure 2B:
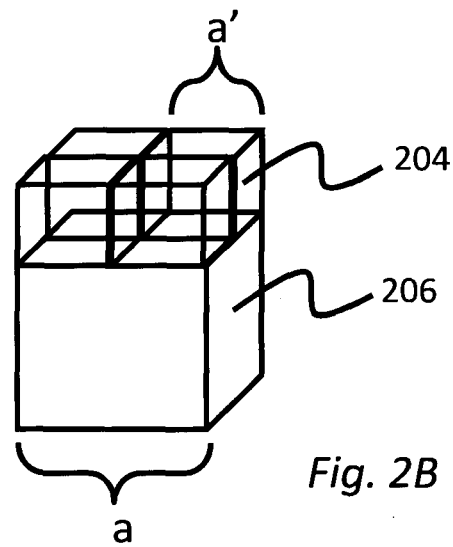
FIG. 2B is a schematic illustration of epitaxial growth were the lattice parameter of the substrate (a) equals 2(a'), where (a') is the lattice parameter of the semiconductor.
Figure 2C:
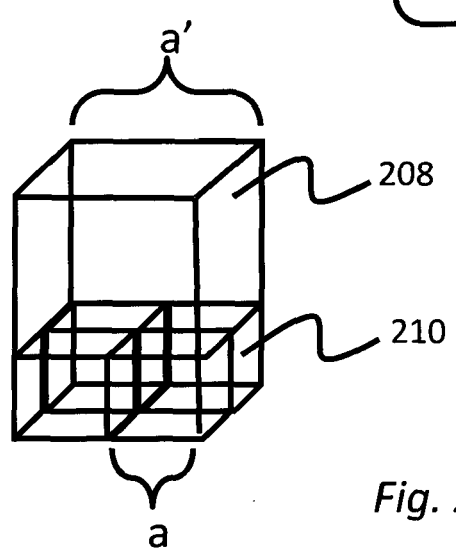
FIG. 2C is a schematic illustration of epitaxial growth were the lattice parameter of the substrate (a) equals (a')/2, where (a') is the lattice parameter of the semiconductor.
Figure 3:
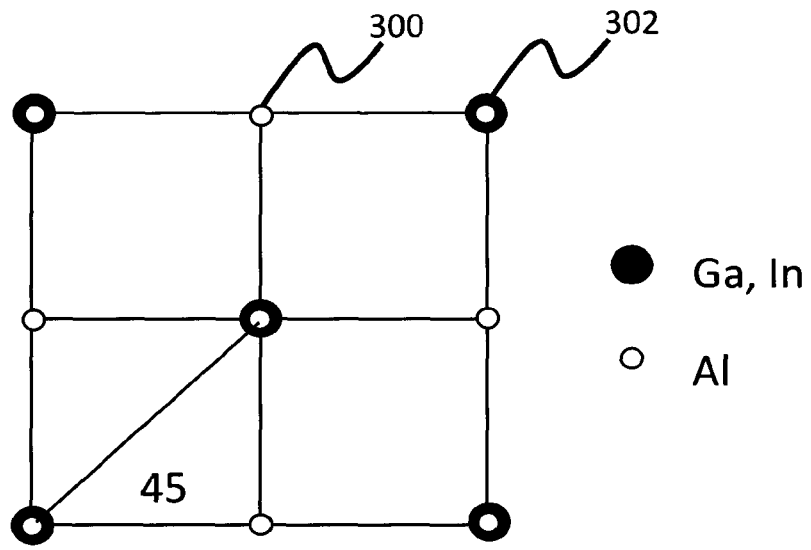
FIG. 3 is a schematic illustration of the arrangement of Group III atoms on the (001) plane of a $Ga_{0.81}In_{0.19}As$ alloy grown coincident site lattice matched on the (001) plane of a crystalline face-centered cubic Al substrate.
Figure 4:
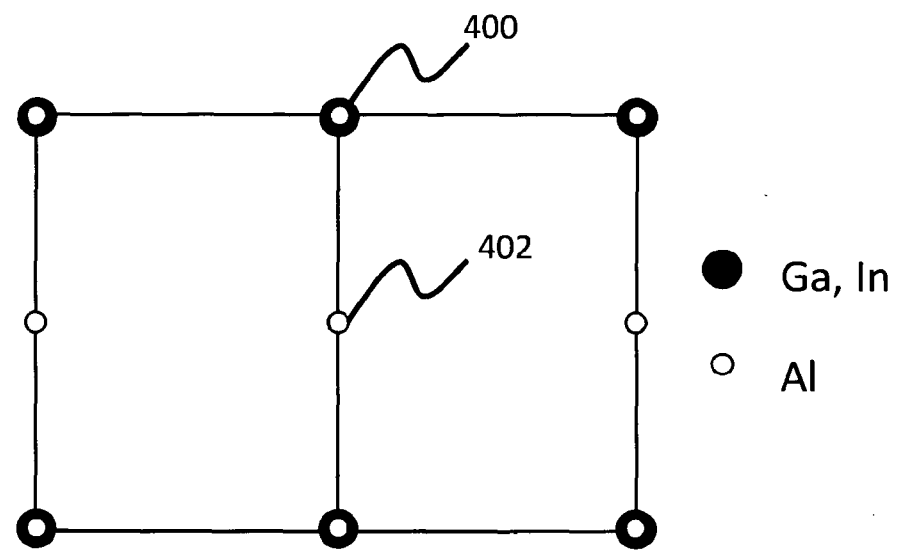
FIG. 4 is a schematic illustration of the arrangement of Group III atoms on the (110) plane of a $Ga_{0.81}In_{0.19}As$ alloy grown coincident site lattice matched on the (110) plane of a crystalline face-centered cubic Al substrate.

As stated above, the first general class of embodiments disclosed features a crystalline semiconductor alloy layer, typically having relatively large surface area, grown by coincident site lattice matched epitaxy on a relatively inexpensive substrate. In addition, selected embodiments will include the semiconductor alloy layer grown through coincident site lattice matched epitaxy directly on the crystalline substrate, without any buffer layer(s) between the semiconductor alloy layer and the crystalline surface of the substrate. To achieve lattice matched epitaxial growth under these circumstances, the semiconductor alloy and the substrate must have lattice parameters that match or are otherwise related to each other. FIGS. 2-4 represent a non-exclusive sampling of various alternative lattice parameter relationships where coincident site lattice matched epitaxy may occur, although the epitaxially grown semiconductor material and the substrate do not share the same lattice parameter. A lattice parameter is customarily defined and used herein as the length between unit cells in a crystal lattice.

For example, FIG. 1 schematically illustrates unit cells of the three space lattice types of the cubic crystal system. These unit cells include a simple cubic (sc) cell 100, a body centered cubic (bcc) cell 102 and a face centered cubic (fcc) cell 104. In each case the lattice parameter (a) is equal to the distance between adjacent atoms which define the corners of the cubic unit cell. The geometry of a unit cell is also typically described by vector nomenclature known as Miller Indices. For example, as shown on FIG. 1, the Miller indices for the lattice axes of each unit cell (as shown on the simple cubic cell 100) are [100], [001] and [010] as shown. In all lattice systems the direction [h, k, l] defines a vector direction which is normal to the surface of a plane or facet (h, k, l) of interest. Accordingly, in the case of each type of cubic lattice shown on FIG. 1 the (001) plane is at the "top" of the unit cell as illustrated.

Highly lattice matched epitaxial growth may most readily occur between materials if the basic crystalline structure and lattice parameter (a) of the respective materials are highly matched. Thus, highly lattice matched growth is possible in homoepitaxy, where the substrate and deposited layers are the same crystalline material. A high degree of lattice matching may be expected when the lattice parameter of the substrate (a) equals the lattice parameter of the material epitaxially grown thereon (a'). An example of directly equivalent lattice matched heteroepitaxial growth is schematically illustrated in FIG. 2A where a cubic crystal 200 of a first material has been epitaxially grown with a high degree of lattice match on a cubic crystal 202 of a second material. For example, GaAs, AlGaAs and AlAs have approximately equal lattice parameters making it possible to epitaxially grow layers of one of these materials on another with a high degree of lattice matching.

As described in detail above, it may be particularly useful to grow selected semiconductors on a relatively inexpensive metal alloy crystalline substrate. This is true where the desired semiconductor device has a large surface area and may thus require a large surface area substrate which can be prohibitively expensive. Typically the semiconductor alloys of interest do not have a lattice parameter (a') which matches the lattice parameter (a) of the inexpensive substrate. Selected embodiments disclosed herein therefore feature the use and preparation of a semiconductor alloy to have a lattice parameter (a') which is geometrically related to the substrate lattice parameter (a), but not necessarily by the relationship (a')=(a). For example, as shown in FIG. 2B, the lattice parameter (a') of a semiconductor alloy 204 may be equal to ½ of the lattice parameter (a) of a substrate 206. Although the lattice parameters (a') and (a) are not equivalent in this case, as shown in FIG. 2B, the semiconductor alloy 204 may in certain instances still be epitaxially grown upon the substrate 206 with a high degree of coincident site lattice matching. Similarly, as shown in FIG. 2C, a semiconductor alloy layer 208 having a lattice parameter of (a') may in certain instances be grown on a substrate 210 where (a') equals 2(a).

Figure 2D:
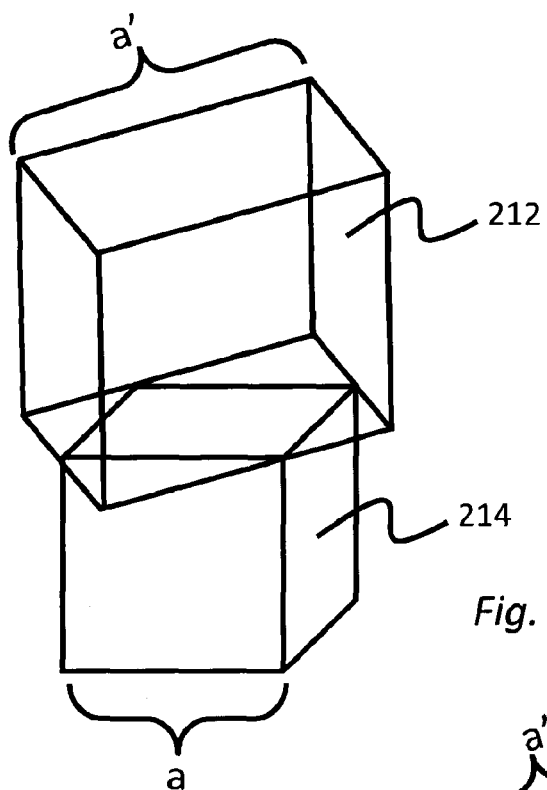
FIG. 2D is a schematic illustration of epitaxial growth were the lattice parameter of the substrate (a) equals (a')/√2, where (a') is the lattice parameter of the semiconductor.
Figure 2E:
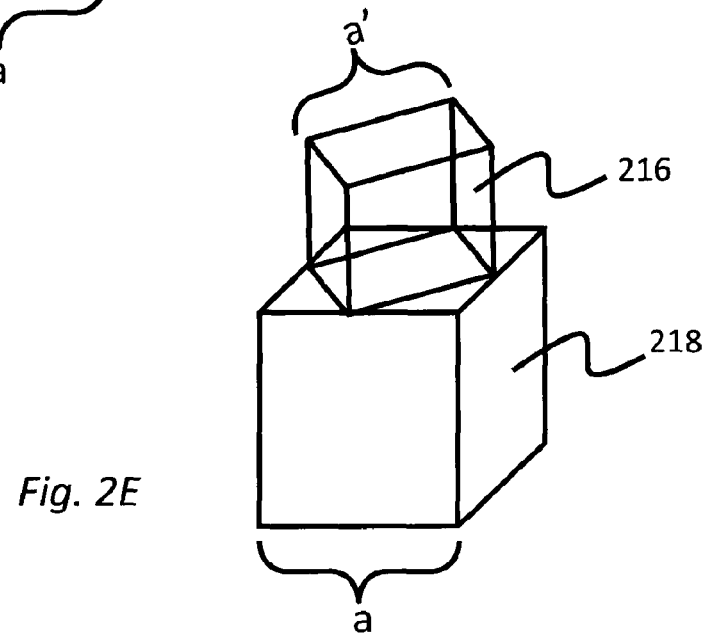
FIG. 2E is a schematic illustration of epitaxial growth were the lattice parameter of the substrate (a) equals √2(a'), where (a') is the lattice parameter of the semiconductor.

FIGS. 2D and 2E illustrate alternative coincident site epitaxial alignments for a cubic material grown on a cubic substrate. The alignments shown in FIGS. 2D and 2E feature lattice matching with a 45° rotated alignment of the unit cell edge around the [001] axis. In the embodiment shown in FIG. 2D, the lattice parameter (a') of the semiconductor material 212 is equal to √2 times the lattice parameter (a) of the substrate 214. Alternatively, in the embodiment illustrated in FIG. 2E, the lattice parameter (a') of the semiconductor material 216 is equal to (a)/√2 where (a) is the lattice parameter of the substrate 218.

A high degree of coincident site lattice matched epitaxial growth between dissimilar materials can be achieved if the above-noted or similar geometric relationships between the lattice parameter of the semiconductor layer (a') and the lattice parameter of a substrate (a) are maintained. In many cases the lattice parameter of a crystalline semiconductor alloy can be manipulated or adjusted to achieve one of the above-described lattice parameter relationships by varying the concentration of elements within the semiconductor alloy. Alternatively, as described in more detail below, the lattice parameter of the substrate may be adjusted to achieve a proper relationship with the lattice parameter of a selected semiconductor alloy of interest by manipulating the concentration of component elements within a substrate alloy. If desired, both the lattice parameter of the substrate and the semiconductor alloy to be grown thereon may be adjusted.

In addition, the techniques for adjusting a lattice parameter as described herein may be combined with known techniques to prepare a semiconductor alloy to have a selected band gap. The combination of these techniques provides for a method of preparing efficient or otherwise desirable electronic devices having highly crystalline layers through coincident site lattice matched epitaxy. The methods disclosed herein may be implemented without the use of buffer layers between the substrate and semiconductor alloy, thus avoiding potential contamination from the buffer layer, defect generation, layer strain and costs associated with the deposition of buffer layers.

Relatively inexpensive metal or metal alloy substrates may be prepared with a crystalline surface by manipulating metal stock at or above the primary or secondary recrystallization temperatures of the metal or alloy. In addition, specific crystal orientations as desired may be produced by undertaking specific thermomechanical processing steps.

For example, Al can be processed into highly (001) cube-textured tapes or foil with a large grain size, by known thermomechanical processing steps. Some advantages of cube textured Al foil as a substrate material are that Al is inexpensive, abundant, light, flexible, corrosion resistant, has good electrical and thermal conductivity, high optical reflectivity, and is non-toxic. Al is also an isoelectronic impurity with a low diffusion coefficient and thus potentially will cause no degradation in electrical properties of a III-V semiconductor layer grown through coincident site lattice matched epitaxy directly on an Al substrate. Some potential problems with an Al substrate are the low melting point of Al (~660° C.) and the high thermal expansion coefficient (~23(° C.−1×10−6)). In addition a suitable cube textured Al substrate will require very large grain sizes to obtain crystalline III-V alloys of the high optical and electronic quality required for devices such as efficient solar cells.

Many of the problems associated with the use of Al as a substrate material can be overcome. For example, the use of the most highly cube-textured Al foil substrates with a large grain size may reduce the potentially harmful effects of grain boundaries. The problems associated with the low melting point of Al and the relatively high thermal expansion of this material when compared to a semiconductor, for example a III-V alloy to be grown thereon may be addressed by utilizing a low temperature epitaxy technique. For example, the low temperature growth of III-V semiconductor alloys is possible with molecular beam epitaxy (MBE). In particular, MBE growth of high quality III-V alloys, such as GaInAs, is possible at temperatures one to two hundred degrees lower than typically required for other techniques such as metal organic chemical vapor deposition, (MOCVD).

As described above, an alternative epitaxial lattice-matching condition for cubic on cubic materials can be achieved for growth on the (001) plane by allowing the lattices to be rotated by 45° around the [001] axis, provided the lattice parameter of the semiconductor (a') is √2 or 1/√2 times the lattice parameter of the substrate (a). For example, FIG. 3 schematically illustrates the lattice matched arrangement of Al atoms 300 on a (001) plane of face-centered cubic Al superimposed on the arrangement of group III atoms, Ga and In, collectively 302, in a (001) plane of zincblende, $Ga_{0.81}In_{0.19}As$ after the zincblende lattice has been rotated 45° around the [001] axis. The lattice parameter of $Ga_{0.81}In_{0.19}As$ is √2 times the lattice parameter of Al and it can be seen that after the lattice rotation of 45° around the [001] axis there is a high degree of correspondence between the positions of some of the Al atoms and the Ga and In atoms, thus this system forms a coincident site lattice. The lattice matching condition is achieved if the semiconductor lattice parameter is either √2 or 1/√2 times the substrate lattice parameter.

Figure 5:
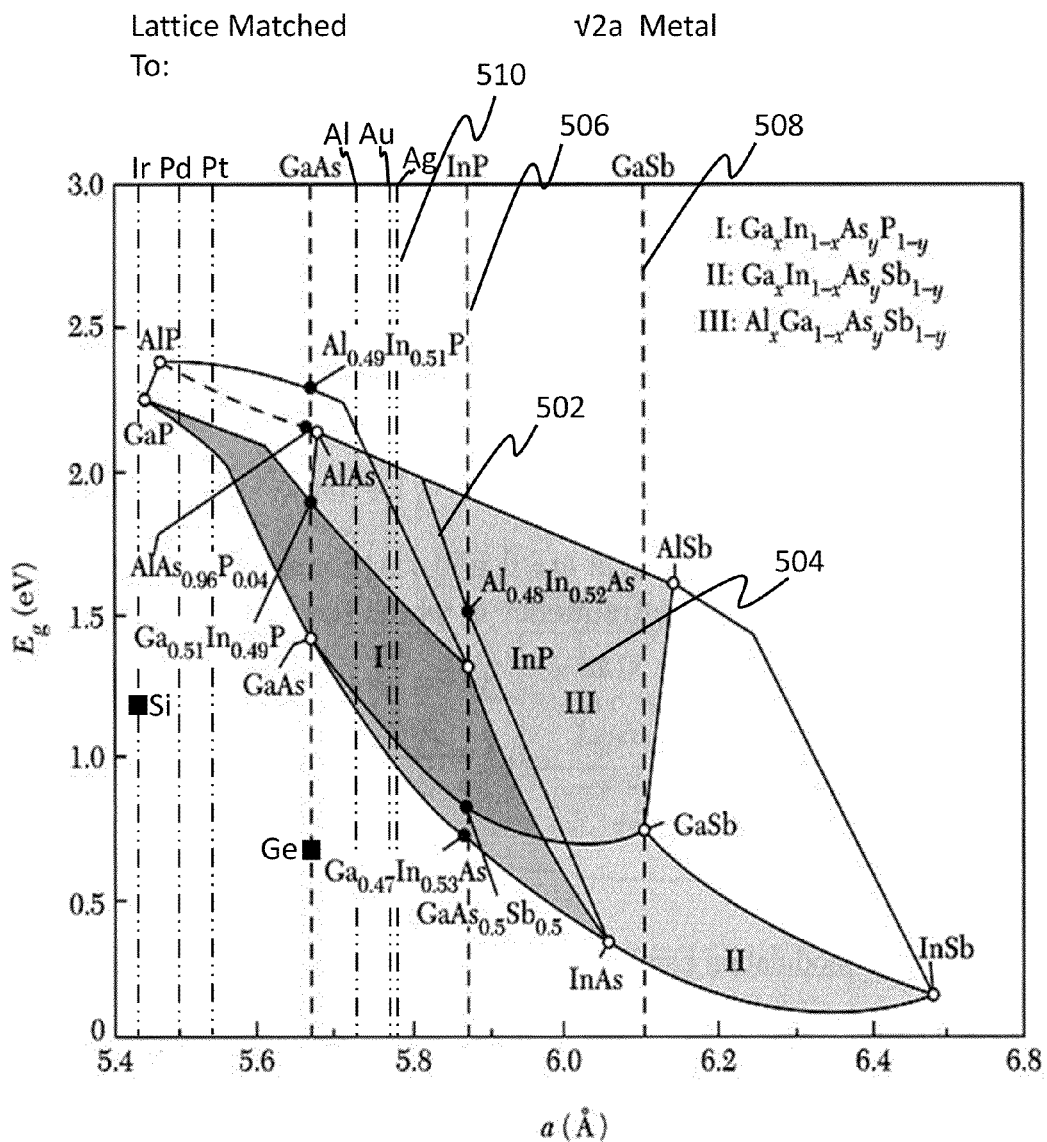
FIG. 5 is a graphic representation of band gap energy as a function of lattice parameter for various III-V semiconductor alloys.

The lattice parameter of pure Al is 4.05 Å and so a lattice matching condition can be achieved, with the 45° lattice rotation described above, to cubic zincblende materials with a lattice parameter of √2×4.05=5.73 Å. This relationship between lattice parameters corresponds to a lattice match to $Ga_{0.81}In_{0.19}As$ with a band gap ~1.15 eV which is close to the optimum for a single junction solar cell. Furthermore, this geometrical relationship corresponds to a lattice match with $Ga_{0.33}In_{0.67}P$ having a band gap of about 1.64 eV, and $Al_{0.34}In_{0.66}P$ having a band gap of about 2.1 eV, as shown in FIG. 5 that shows the band gap energy versus lattice parameter for III-V semiconductor alloys with vertical lines drawn representing the lattice matching conditions to various III-V binary alloy substrates and to various face-centered cubic metals made possible by the 45° lattice rotation described above. Thus the implementation of coincident site lattice matched rotated epitaxial growth permits the possibility of growing lattice-matched tandem, triple junction, or other multi junction III-V photovoltaic cells with high theoretical efficiencies on a relatively inexpensive Al substrate. Furthermore, devices such as the tandem III-V photovoltaic cell described above may be produced without the use of intervening buffer layers.

The optional use of antimonide or quaternary III-V alloys provides the possibility of further band gap tuning as shown in FIG. 5. Alternatively, the lattice parameter of the Al can be changed by alloying Al with other metals, such as Au, Ag, Cu, Pd etc. to provide for the preparation of other coincident site lattice-matched alloy band gap combinations, as illustrated in FIG. 5.

The non-limiting examples described above involve the use of lattice matched coincident site epitaxy to prepare a semiconductor layer or a device having many layers on the (001) plane of a cubically crystallized substrate. The described techniques may be implemented on other crystal planes as well. For example, as shown in FIG. 4, the Ga and In atoms 400 of a suitable group III-V semiconductor alloy, e.g., $Ga_{0.81}In_{0.19}As$, may be coincidentally lattice matched to Al substrate atoms 402 on the (110) substrate surface with 90° rotation around the [110] axis.

The non-limiting examples described above involves the use of lattice matched coincident site epitaxy to prepare a semiconductor layer of a device having many layers on the (001) plane of a cubically crystallized substrate. This concept can also be applied to the growth of cubic semiconductor alloys on the (001) surface of body-centered and simple tetragonal crystals (where the a and b lattice parameters are equal). Alternatively, it may be used for the growth of body-centered and simple tetragonal crystals on the (001) surface of cubic or body-centered and simple tetragonal crystals (where the a and b lattice parameters are equal).

The non-limiting examples described above primarily, but not exclusively, feature the adjustment of semiconductor alloy compositions to achieve a lattice parameter relationship with a known and readily available substrate. In addition, semiconductor alloy compositions may be adjusted to produce materials having desirable band gap characteristics.

For example, elements from group III, e.g., B, Al, Ga, In, Tl and elements from group V, e.g., N, P, As, Sb, Bi of the periodic table, can form a wide range of compound semiconductor alloys, including binaries such as GaAs, InP, ternaries such as GaInAs, InGaN, quaternaries such as GaInAsP, InGaAlN, and other alloys containing higher numbers of component elements. These alloys have a wide range of structural and electronic properties. FIG. 5 graphically represents the room temperature energy band gap of some of the III-V compounds and their alloys as a function of lattice constants. The lines connecting pairs of points corresponding to two different binary III-V compound semiconductors, for example line 502 show the band gaps of the ternary III-V alloy formed from the two binary III-V semiconductor alloys as a function of composition and lattice constant. The areas enclosed by the lines representing the ternary III-V alloys, for example, area 504, illustrates the band gap as a function of composition and lattice constant of quaternary III-V alloys, three examples of which are shown shaded. The vertical dashed lines, for example, dashed lines 506 and 508, indicate the III-V alloys and their band gaps that can be grown lattice matched to commonly used binary III-V compound semiconductor alloy substrates. The dotted/dashed vertical lines for example, line 510, indicate the III-V alloys and their band gaps that can be grown lattice matched to some of the fcc metals using coincident site lattice matched epitaxy after a lattice rotation of 45° as described previously. Also shown are two squares representing the band gap and lattice constant of the group IV semiconductors Si and Ge.

In other non-exclusive embodiments, a particular semiconductor alloy may be required, but relatively difficult to obtain because a suitable substrate for conventional heteroepitaxy is unavailable. For example, InGaN alloys are of great interest for the manufacture of light emitting diodes and lasers for use in solid state lighting applications, transistors and in photovoltaic devices. Presently, there exists a major problem with the use of these materials for light emitting devices, because the efficiency of devices at wavelengths between ~500 nm and 600 nm, corresponding to what is known as the "green gap", are very low. One possible cause of the observed inefficiencies is that the material quality in InGaN alloys having a band gap suitable for emission in the "green gap" region is degraded due to a tendency toward phase separation of the InGaN prepared by conventional methods. One possibility for avoiding this serious problem is the growth of lattice-matched InGaN alloys in which phase separation can be suppressed. However, currently no suitable lattice-matched substrate for the InGaN alloys having band gaps suitable for emission in the "green gap" is known.

Lattice-matching will also typically lead to a significant reduction in dislocation density in the material and an enhancement in device performance. InGaN normally exists in the wurtzite or hexagonal crystal form. However, a metastable cubic or zincblende form of InGaN alloy can be obtained if the material is epitaxially grown on a suitably oriented cubic crystal substrate. The cubic form of GaN has a lattice parameter of 4.50 Å and the cubic form of InN has a lattice parameter of 4.98 Å and so cubic InGaN alloys can be prepared to have lattice parameters between these two values by carefully varying the component concentrations in the alloy. The growth of the cubic form of InGaN can be promoted by growing the desired semiconductor material on a highly cubic crystallized substrate.

As described above, coincident site lattice matched epitaxy may be made to occur for a cubic material on a cubic substrate with a 45° rotation of unit cell edges within the (001) plane. The lattice parameter of the deposited cubic material will typically be either $\sqrt{2}$ or $1/\sqrt{2}$ times the lattice parameter of the cubic substrate material when this type of lattice match occurs.

The cubic form of $In_{0.29}Ga_{0.71}N$ crystalline alloy may be of use in solid state lighting applications. From Table 1, it may be observed that for lattice-matching the $In_{0.29}Ga_{0.71}N$ alloy of interest to a cubic substrate using the 45° lattice rotation described above, a cubic substrate material with a lattice parameter of either 6.56 Å or 3.28 Å is required. In fact for any selected InGaN alloy with a composition between the end points of GaN and InN, cubic substrate materials are desired with lattice parameters ranging between 6.36 Å and 7.04 Å or between 3.18 Å and 3.52 Å assuming the InGaN alloy is grown using coincident site lattice matched epitaxy with a 45° rotation around the [001] axis of the cubic substrate material.

TABLE 1

| Material | Crystal structure | Lattice parameter (Å) | $\sqrt{2}a$ (Å) | $a/\sqrt{2}$ (Å) | Thermal expansion coeff..(° C.$^{-1}$ × 10$^{-6}$) | Melting point (° C.) |
|---|---|---|---|---|---|---|
| GaN | zincblende | 4.50 | 6.36 | 3.18 | ~5.6 at 800 K | ~2500 |
| InN | zincblende | 4.98 | 7.04 | 3.52 | ~3.6 | 1627 |
| $In_{0.29}Ga_{0.71}N$ | zincblende | 4.64 | 6.56 | 3.28 | | |

As shown in Table 2, several candidate substrates may be fabricated or selected for the coincident site lattice matched epitaxial growth of various alloys. For example, a $In_{0.29}Ga_{0.71}N$ alloy is reasonably coincident site lattice matched to CdTe, InSb, KBr, and BaSe with the $\sqrt{2}a$ value. The degree of lattice match can be enhanced if desired by adjusting the substrate alloy composition. Ta and Nb are very close to lattice matching $In_{0.29}Ga_{0.71}N$ alloy with the $a/\sqrt{2}$ value. For growth of the endpoint zincblende, GaN; SnTe and BaS are possible substrates as these materials are close to lattice-matched with the $\sqrt{2}a$ value. Mo and W are very close to lattice matching to the $a/\sqrt{2}$ value. In all cases the substrate alloy may be tuned to achieve a highly correlated lattice match between the substrate and the InGaN alloy of interest.

TABLE 2

| Material | Crystal structure | Lattice parameter (Å) | Thermal expansion coeff... (° C.$^{-1}$ × 10$^{-6}$) | Melting point (° C.) |
|---|---|---|---|---|
| KCl | rocksalt | 6.30 | 33.4 | 776 |
| SnTe | rocksalt | 6.33 | 21.3 | 806 |
| BaS | rocksalt | 6.39 | ? | 1200 |
| HgTe | zincblende | 6.43 | 4 | 670 |
| PbTe | rocksalt | 6.46 | 1.97 | 924 |
| CdTe | zincblende | 6.48 | 5.0 | 1366 |
| InSb | zincblende | 6.48 | 5.37 | 527 |
| KBr | rocksalt | 6.6 | 39? | 730 |
| BaSe | rocksalt | 6.6 | 14.6? | 1780 |
| Mo | bcc | 3.15 | 4.8 | 2623 |
| W | bcc | 3.17 | 4.5 | 3422 |
| Ta | bcc | 3.30 | 6.3 | ~3000 |
| Nb | bcc | 3.30 | 7.3 | 2477 |
| Ni | fcc | 3.52 | 13.4 | 1455 |

Figure 6:
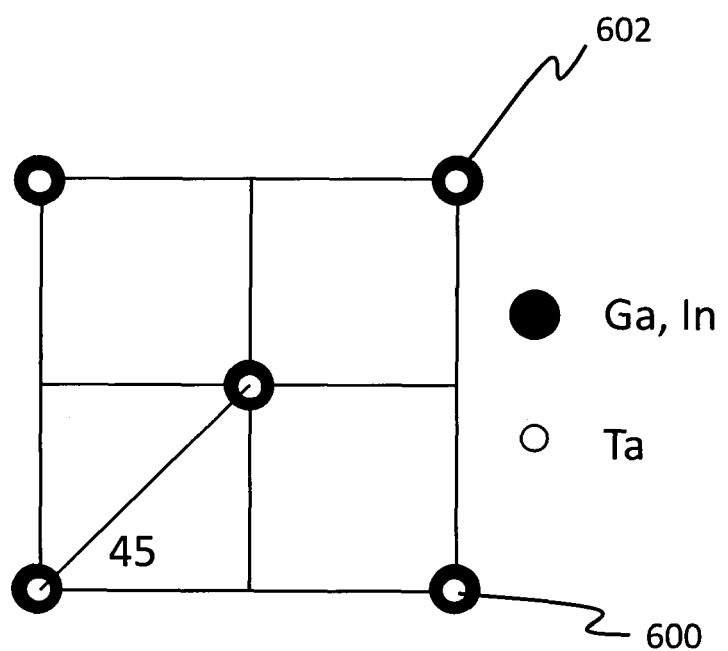
FIG. 6 is a schematic illustration of the arrangement of Group III atoms on the (001) plane of a zincblende $In_{0.35}Ga_{0.65}N$ alloy grown coincident site lattice matched on the (001) plane of a body-centered cubic Ta substrate.

For further example, FIG. 6 shows the arrangement of Ta atoms 600 on the (001) plane of a body-centered cubic (bcc) Ta substrate, superimposed on the arrangement of group III atoms of Ga and In 602 on the (001) plane of zincblende $In_{0.35}Ga_{0.65}N$ after the $In_{0.35}Ga_{0.65}N$ lattice has been rotated 45° around the [001] axis. The lattice parameter of zincblende $In_{0.35}Ga_{0.65}N$ is $\sqrt{2}$ times the lattice parameter of Ta and it can be seen that after the lattice rotation of 45° around the [001] axis there is very high degree of correspondence between the positions of the Ta atoms and the Ga or In atoms thus, this system is highly coincident site lattice matched.

Figure 7:
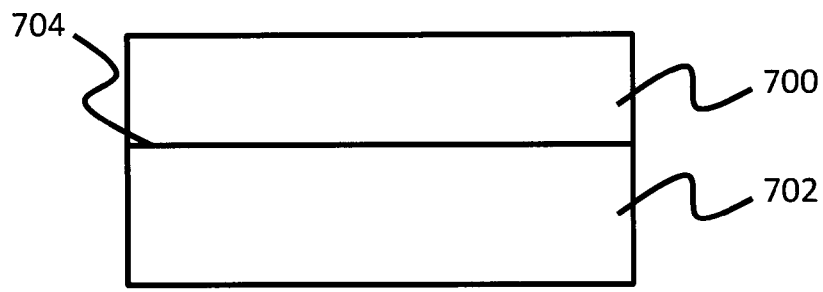
FIG. 7 is a schematic illustration of a semiconductor layer prepared by coincident site lattice matched epitaxy in accordance with the disclosure herein.

The methods and techniques described above may be utilized to fabricate many diverse types of semiconductor layers and devices. For example, as shown in FIG. 7, a selected semiconductor alloy layer 700 which may be but is not limited to a III-V alloy, may be grown on a cubic crystalline substrate surface 702 by coincident site lattice matched epitaxy. In one embodiment the semiconductor alloy layer 700 may be prepared from a semiconductor alloy of Group III and Group V elements. For example, the semiconductor alloy layer may be an Al-containing arsenide and phosphide alloy, an antimonide or dilute nitride or bismide alloy. The alloy may be selected from the following non-exclusive list: substantially GaInAs, substantially GaInP, substantially GaInAsP, substantially AlInP substantially GaInAlP, substantially AlInAsP, substantially AlGaAsP, substantially GaInAsSb, substantially GaInAsN, and substantially GaAsBi. The foregoing list is set forth utilizing an abbreviated form. Alternatively, the alloy may be selected from the following non-exclusive list which is set forth in an expanded form: substantially $Ga_xIn_{1-x}As$, substantially $Al_xIn_{1-x}As$, substantially $Ga_xIn_{1-x}P$, substantially $Ga_xIn_{1-x}As_yP_{1-y}$, substantially $Al_xIn_{1-x}P$ substantially $Ga_xIn_yAl_{1-x-y}P$, substantially $Ga_xIn_yAl_{1-x-y}As$, substantially $Al_xIn_{1-x}As_yP_{1-y}$, substantially $Al_xGa_{1-x}As_yP_{1-y}$, substantially $GaAs_ySb_{1-y}$, substantially $AlAs_ySb_{1-y}$, substantially $Ga_xIn_{1-x}As_ySb_{1-y}$, substantially $Al_xGa_{1-x}As_ySb_{1-y}$, substantially $Ga_xIn_{1-x}As_yN_{1-y}$, substantially $GaAs_yBi_{1-y}$ and substantially $Ga_xIn_{1-x}As_yBi_{1-y}$, or a similar semiconductor alloy of interest including but not limited to any group III-V semiconductor. It is important to note that the embodiments disclosed herein are not limited to any specific alloy, unless so limited by a claim. The above lists are intended to be of representative alloys and are not to be construed as limiting upon the scope of the disclosed embodiments.

The substrate 702 may include a face centered cubic crystalline surface with the (001) plane at the surface 704 although other crystalline surfaces are within the scope of the present disclosure. In particular, the substrate 702 may be a substantially Al substrate. If the Al substrate is substantially pure, for example having 99% purity, the semiconductor alloy layer 700 may be $Ga_{0.81}In_{0.19}As$. In this particular configuration the lattice parameter (a) of the substrate 702 is about 4.05 Å and the lattice parameter (a') of the semiconductor layer 700 is about 5.73 Å, which lengths are related to each other by (a')=$\sqrt{2}$(a) making the specifically described system suitable for fabrication by 45° rotated coincident site lattice matched epitaxy.

It may further be noted from FIG. 7 that no buffer layer is required if the above relationship between lattice parameters is observed.

In an alternative non-limiting specific example generally based upon the configuration FIG. 7, the semiconductor alloy layer 700 may be a specific group III-nitride alloy such as an InGaAlN alloy selected for its suitability in a light emitting diode, laser or solid state lighting application where the alloy has a selected band gap providing for light emission approximately between 500 nm and 600 nm. As noted, above, InGaN normally exists in the wurtzite or hexagonal crystal form. However, metastable, cubic or zincblende forms of InGaN alloys can be obtained if the material is epitaxially grown on a suitably oriented crystal substrate. For example, $In_{0.29}Ga_{0.71}N$ alloy has a lattice parameter of about 4.64 Å and a band gap of about 2.2 eV, which corresponds to an emission wavelength of about 560 nm. A device created by coincident site lattice matched epitaxy with this alloy may thus require a substrate with a lattice parameter related to 4.64 Å. As shown in Table 2 above, several suitable materials or alloys for the substrate 702 may be prepared which have a lattice parameter (a)=$\sqrt{2}$(a') or (a')/$\sqrt{2}$.

The described methods and techniques may also be used to prepare more complicated multilayer devices having any achievable number of layers. For example, as is shown schematically in FIG. 8, a two junction, fully lattice matched, photovoltaic cell 800 may be fabricated using the techniques described herein. The embodiment of FIG. 8 is representative of one example of a type of device which may be fabricated using the disclosed technique and is not limiting upon the scope of the disclosure.

Figure 8:
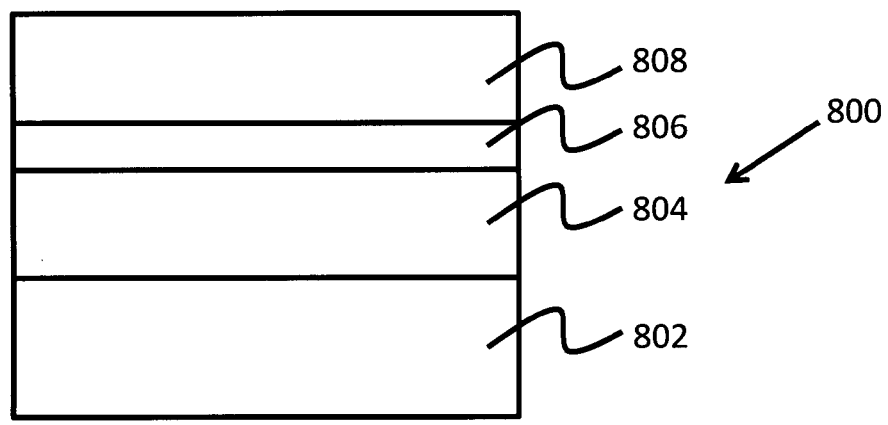
FIG. 8 is a schematic illustration of a device prepared by coincident site lattice matched epitaxy as described herein.

In the FIG. 8 embodiment the substrate layer 802 is a cube textured Al foil substrate as described herein. A bottom junction 804 may be grown on the Al substrate 802 by coincident site lattice matched epitaxy without any buffer layer between the bottom junction 804 and substrate 802. For example, a suitable bottom junction 804 may be $Ga_{0.81}In_{0.19}As$ which alloy has a band gap of 1.15 eV. One or more suitable tunnel junction layers 806 may be grown on top of the bottom junction 804. The tunnel junction layer(s) 806 may be grown by coincident site lattice matched epitaxy or traditional lattice matched epitaxy to preserve the crystalline structure of the bottom junction 804. In such case, a top junction 808 may be grown on the tunnel junction layers 806. The top junction 808 may for example, be a GaInAlP alloy with a band gap tuned to match the expected incident spectra. In addition, the top junction may be tuned to provide for coincident site lattice matched epitaxy with the junction layer 806 and underlying layers. For example, the GaInAlP top junction layer may have a band gap of 1.64-2.1 eV in one specific device as illustrated in FIG. 8.

Figure 9:
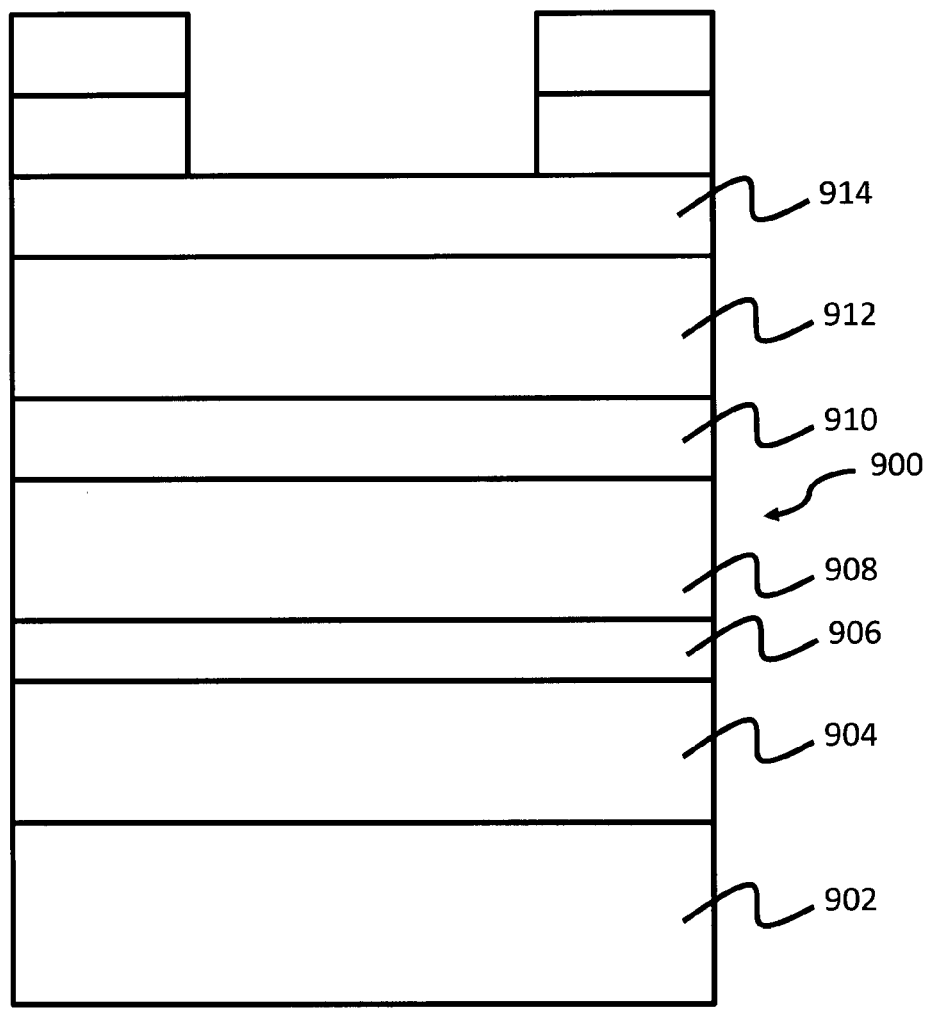
FIG. 9 is a schematic illustration of an alternative device prepared by coincident site lattice matched epitaxy as described herein.

A further representative example device is schematically illustrated in FIG. 9. FIG. 9 shows a lattice matched III-V single junction photovoltaic cell 900 grown in multiple layers with coincident site lattice matched epitaxy upon a cube textured Al substrate 902. Each of the device and window layers 904-914 illustrated in FIG. 9 may be prepared from semiconductor alloys specifically formulated to have a lattice parameter which is related to the lattice parameter of the substrate 902 as described herein.

Various embodiments of the disclosure may also include permutations of the various elements recited in the claims as if each dependent claim was a multiple dependent claim incorporating the limitations of each of the preceding dependent claims as well as the independent claims. Such permutations are expressly within the scope of this disclosure.

While aspects have been particularly shown and described with reference to a number of embodiments, it may be understood by those skilled in the art that changes in the form and details may be made to the various embodiments disclosed herein without departing from the spirit and scope of the claims and that the various embodiments disclosed herein are not intended to act as limitations on the scope of the claims. All references cited herein are incorporated in their entirety by reference.

The description has been presented for purposes of illustration and description, but is not intended to be exhaustive or limiting to the form disclosed. The scope is limited only by the scope of the following claims. Many modifications and variations will be apparent to those of ordinary skill in the art. The embodiment described and shown in the figures was chosen and described in order to best explain the principles, the practical application, and to enable others of ordinary skill in the art to understand the various embodiments with various modifications as are suited to the particular use contemplated.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

What is claimed is:

1. A method of fabricating a semiconductor layer comprising:
   providing one of a metal or metal alloy substrate having a crystalline surface with a known lattice parameter (a); and
   growing a crystalline semiconductor alloy layer on the crystalline surface of the substrate by coincident site lattice matched epitaxy, without any buffer layer between the semiconductor alloy layer and the crystalline surface of the substrate, wherein the semiconductor alloy layer is prepared to have a lattice parameter (a') that is related to the lattice parameter (a); and
   preparing the semiconductor alloy layer to have the lattice parameter (a') which is related to the substrate lattice parameter by one of: $2(a)$, $(a)/2$, $\sqrt{2}(a)$ and $(a)/\sqrt{2}$.

2. The method of fabricating the semiconductor layer of claim 1 further comprising preparing the semiconductor alloy layer to have a selected band gap.

3. The method of fabricating the semiconductor layer of claim 2 further comprising preparing the semiconductor alloy layer from a semiconductor alloy of Group III and Group V elements.

4. The method of fabricating the semiconductor layer of claim 3 further comprising preparing the semiconductor alloy layer of one of the following alloys: substantially $GaxIn1-xAs$, substantially $AlxIn1-xAs$, substantially $GaxIn1-xP$, substantially $GaxIn1-xAsyP1-y$, substantially $AlxIn1-xP$, substantially $GaxInyAl1-x-yP$, substantially $GaxInyAl1-x-yAs$, substantially $AlxIn1-xAsyP1-y$, substantially $AlxGa1-xAsyP1-y$, substantially $GaAsySb1-y$, substantially $AlAsySb1-y$, substantially $GaxIn1-xAsySb1-y$, substantially $AlxGa1-xAsySb1-y$, substantially $GaxIn1-xAsyN1-y$, substantially $GaAsyBi1-y$ and substantially $GaxIn1-xAsyBi1-y$.

5. The method of fabricating the semiconductor layer of claim 1 further comprising:
   providing the metal or metal alloy substrate comprising a face centered cubic crystalline lattice with the (001) plane at the surface upon which the crystalline semiconductor alloy layer is grown.

6. The method of fabricating the semiconductor layer of claim 4 further comprising providing the metal or metal alloy substrate as a substantially Al substrate.

7. The method of fabricating the semiconductor layer of claim 6 further comprising:
   providing the Al substrate of greater than 99% purity having a lattice parameter of about 4.05 Å; and
   growing the semiconductor alloy layer as a crystalline III-V semiconductor alloy layer on the substrate surface by coincident site lattice matched epitaxy, without any buffer layer between the semiconductor alloy layer and the crystalline surface of the substrate, wherein the semiconductor alloy is prepared to have a lattice parameter of about 5.73 Å.

8. The method of fabricating the semiconductor layer of claim 1 further comprising growing the crystalline semiconductor alloy layer directly on the crystalline surface of the substrate by molecular beam epitaxy.

9. A method of fabricating an electronic device comprising:
   providing one of a metal or metal alloy substrate having a crystalline surface with a known lattice parameter (a);
   growing a first crystalline semiconductor alloy layer on the crystalline surface of the substrate by coincident site lattice matched epitaxy, without any buffer layer between the first semiconductor alloy layer and the crystalline surface of the substrate, wherein the first semiconductor alloy layer is prepared to have a lattice parameter (a') that is related to the lattice parameter (a);
   epitaxially growing a second crystalline semiconductor alloy layer on the first semiconductor alloy layer;
   preparing the first semiconductor alloy to have a lattice parameter (a') which is related to the substrate lattice parameter by one of; $2(a)$, $(a)/2$, $\sqrt{2}(a)$ and $(a)/\sqrt{2}$; and
   preparing the second crystalline semiconductor alloy to have a lattice parameter (a'') which is related to the lattice parameter (a') by one of, $2(a')$, $(a')/2$, $\sqrt{2}(a')$ and $(a')/\sqrt{2}$.

10. The method of fabricating the electronic device of claim 9 further comprising: preparing the first semiconductor alloy layer and the second semiconductor alloy to have differing selected band gaps.

11. The method of fabricating the electronic device of claim 10 wherein the fabricated device is a photovoltaic device.

* * * * *